US010727123B2

(12) United States Patent
Lai et al.

(10) Patent No.: US 10,727,123 B2
(45) Date of Patent: Jul. 28, 2020

(54) INTERCONNECT STRUCTURE WITH FULLY SELF-ALIGNED VIA PATTERN FORMATION

(71) Applicant: International Business Machines Corporation, Armonk, NY (US)

(72) Inventors: Kafai Lai, Poughkeepsie, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/011,503

(22) Filed: Jun. 18, 2018

(65) Prior Publication Data

US 2019/0385910 A1 Dec. 19, 2019

(51) Int. Cl.
*H01L 21/768* (2006.01)
*H01L 23/522* (2006.01)
*H01L 21/285* (2006.01)

(52) U.S. Cl.
CPC .. *H01L 21/76897* (2013.01); *H01L 21/28562* (2013.01); *H01L 21/76816* (2013.01); *H01L 21/76843* (2013.01); *H01L 23/5226* (2013.01)

(58) Field of Classification Search
CPC ........... H01L 29/66545; H01L 29/6656; H01L 29/66795; H01L 21/7682; H01L 21/76897
See application file for complete search history.

(56) References Cited

U.S. PATENT DOCUMENTS

| 5,891,513 | A | 4/1999 | Dubin et al. |
| 5,942,801 | A * | 8/1999 | Tran .................. H01L 21/76801 257/758 |
| 7,514,361 | B2 | 4/2009 | Bonilla et al. |
| 7,727,888 | B2 | 6/2010 | Yang et al. |
| 8,138,604 | B2 | 3/2012 | Yang et al. |
| 8,361,900 | B2 | 1/2013 | Pan et al. |
| 8,664,766 | B2 | 3/2014 | Yang et al. |
| 8,872,304 | B2 | 10/2014 | Oshida |
| 9,312,222 | B2 * | 4/2016 | Ting .................... H01L 23/5329 |
| 9,379,055 | B2 | 6/2016 | Oshida |
| 9,431,297 | B2 | 8/2016 | Wu et al. |
| 2004/0253811 | A1 * | 12/2004 | Lee .................. H01L 21/02063 438/633 |

(Continued)

*Primary Examiner* — Zandra V Smith
*Assistant Examiner* — John M Parker
(74) *Attorney, Agent, or Firm* — Vazken Alexanian; Otterstedt, Wallace & Kammer, LLP (57) ABSTRACT

A method of increasing a tolerance to misalignment errors in forming an interconnect via includes: providing a dielectric substrate including at least first and second adjacent metal conductors laterally from one another in a lower metal wiring layer of the integrated circuit; forming a capping layer over at least a portion of an upper surface of the substrate; forming an insulting layer on at least a portion of the capping layer; forming an opening through the insulating and capping layers to expose the first metal conductor; forming a conductive pedestal on the first metal conductor, the conductive pedestal capping an overlay region in the substrate between the first and second metal conductors resulting from misalignment of the opening relative to the first metal conductor; forming a conductive liner on sidewalls of the opening and on the conductive pedestal; and filling the opening with a conductive material to form the via.

9 Claims, 7 Drawing Sheets

(56) References Cited

U.S. PATENT DOCUMENTS

| | | |
|---|---|---|
| 2006/0131630 A1* | 6/2006 | Sun .................. H01L 21/76897 |
| | | 257/296 |
| 2010/0025855 A1* | 2/2010 | Streck ............... H01L 21/76814 |
| | | 257/773 |
| 2011/0183512 A1* | 7/2011 | Cho .................. H01L 21/76831 |
| | | 438/627 |
| 2013/0207269 A1 | 8/2013 | Oshida |
| 2015/0004782 A1 | 1/2015 | Oshida |
| 2016/0099174 A1 | 4/2016 | Wu et al. |
| 2016/0365276 A1 | 12/2016 | Wu et al. |
| 2019/0080960 A1* | 3/2019 | Ho .................... H01L 21/76879 |

\* cited by examiner

INTERCONNECT STRUCTURE WITH FULLY SELF-ALIGNED VIA PATTERN FORMATION

BACKGROUND

The present invention relates to the electrical, electronic, and computer arts, and, more particularly, to interconnection structures and methods for fabricating same.

In standard integrated circuit (IC) fabrication technology, interconnects serve as pathways of the IC, connecting various elements or functional blocks of the IC into a functioning whole and to the outside world. An IC typically has multiple interconnect levels (or metal layers) which vary in number depending on the complexity of the device and/or the fabrication technology employed, among other factors. These interconnect levels are formed in distinct vertical planes separated from one another by insulating layers formed therebetween. Elements in two different interconnect levels are electrically connected using vias, which are essentially holes etched through the IC and filled or lined with conductive material to form a conductive plug.

As IC feature size and spacing continually shrink, it becomes increasingly more challenging to align the vias with their underlying metal wires being connected. Such misalignment results in an overlay error, which can cause an unwanted electrical short between the via and a corresponding lower metal wire. Alternatively, this misalignment of the interconnect via may go undiscovered during wafer testing, only to manifest itself subsequently as time-dependent dielectric breakdown in the IC device, thereby resulting in premature failure of the device or severe performance degradation.

SUMMARY

Aspects according to one or more embodiments of the present invention provide a self-aligned interconnect via methodology and structure that beneficially prevents electrical shorting in the presence of misalignment between interconnect vias and corresponding lower metal features.

In accordance with an embodiment of the invention, an interconnect structure having an increased tolerance to misalignment errors in an IC includes a dielectric substrate including at least first and second metal conductors formed in a lower metal wiring layer of the integrated circuit, the first and second metal conductors being adjacent to one another and spaced laterally from one another in the substrate. A capping layer is formed over at least a portion of an upper surface of the substrate, and an insulting layer is formed on at least a portion of the capping layer. The interconnect structure further includes a conductive pedestal formed on the upper surface of the first metal conductor exposed by an opening through the insulating and capping layers, the conductive pedestal capping an overlay region in the dielectric substrate between the first and second metal conductors resulting from misalignment of the opening relative to the first metal conductor. A conductive liner is formed on sidewalls of the opening and on an upper surface of the conductive pedestal exposed in the opening, and the opening is substantially filled with a conductive material formed on the conductive liner, the conductive material forming the interconnect structure.

In accordance with another embodiment of the invention, a method for increasing a tolerance to misalignment errors in forming an interconnect via in an IC includes the steps of: providing a dielectric substrate including at least first and second metal conductors in a lower metal wiring layer of the integrated circuit, the first and second metal conductors being adjacent to one another and spaced laterally from one another in the substrate; forming a capping layer over at least a portion of an upper surface of the substrate; forming an insulting layer on at least a portion of the capping layer; forming an opening through the insulating and capping layers to expose an upper surface of the first metal conductor; forming a conductive pedestal on the upper surface of the first metal conductor exposed through the opening, the conductive pedestal capping an overlay region in the dielectric substrate between the first and second metal conductors resulting from misalignment of the opening relative to the first metal conductor; forming a conductive liner on sidewalls of the opening and on an upper surface of the conductive pedestal exposed in the opening; and filling the opening with a conductive material to form the interconnect via.

Techniques as disclosed herein can provide substantial beneficial technical effects. By way of example only and without limitation, one or more embodiments may provide one or more of the following advantages:

elimination of electrical shorting in the presence of misalignment between interconnect vias and lower metal features;
  fully self-aligned and scalable with shrinking feature sizes and spacing;
  fabrication process flow is fully compatible with standard back-end-of-line (BEOL) integration schemes; and
  enhanced reliability of IC interconnects.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The following drawings are presented by way of example only and without limitation, wherein like reference numerals (when used) indicate corresponding elements throughout the several views, and wherein:

FIGS. 1A and 1B conceptually depict an illustrative interconnect via with associated misalignment, where

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative semiconductor interconnect vias and methods of forming same which provide a self-aligned via technique that advantageously prevents electrical shorting in the presence of overlay error between interconnect vias and adjacent lower metal features in an integrated circuit (IC). It is to be appreciated, however, that the specific structures and/or methods illustratively shown and described herein are to be considered exemplary as opposed to limiting. For example, embodiments of the invention are directed more generally to apparatus and methods for forming an interconnect structure having improved tolerance to misalignment errors which may occur in the semiconductor fabrication process, thereby reducing the likelihood of electrical shorts and improving reliability in the fabricated IC device. Moreover, it will become apparent to those skilled in the art given the teachings herein that numerous modifications can be made to the embodiments shown that are within the scope of the appended claims. That is, no limitations with respect to the embodiments shown and described herein are intended or should be inferred.

In the following description, certain specific details are set forth in order to provide a more thorough understanding of various aspects of the disclosed subject matter. However, it is to be appreciated that one or more embodiments of the disclosed subject matter may be practiced without all these specific details. In some instances, well-known circuitry and/or methods comprising embodiments of the subject matter disclosed herein have not been described in detail to avoid obscuring the descriptions of other aspects of the present disclosure.

Unless the context requires otherwise, throughout the specification and appended claims, the word "comprise" and variations thereof, such as "comprises" and "comprising" are to be construed in an open, inclusive sense; that is, as "including, but not limited to."

Reference throughout the specification to "one embodiment" or "an embodiment" is intended to imply that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Moreover, the particular features, structures, and/or characteristics may be combined in any suitable manner in one or more aspects of the present disclosure.

Reference throughout the specification to integrated circuits is broadly intended to include integrated circuit components built on semiconducting substrates, whether or not the components are electrically coupled together into a circuit or able to be interconnected.

Figure 1A:
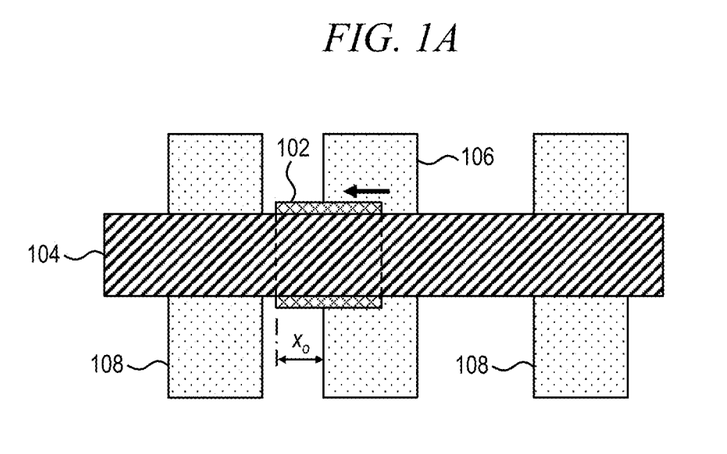
FIG. 1A is a top plan view of at least a portion of an IC showing an interconnect via.
Figure 1B:
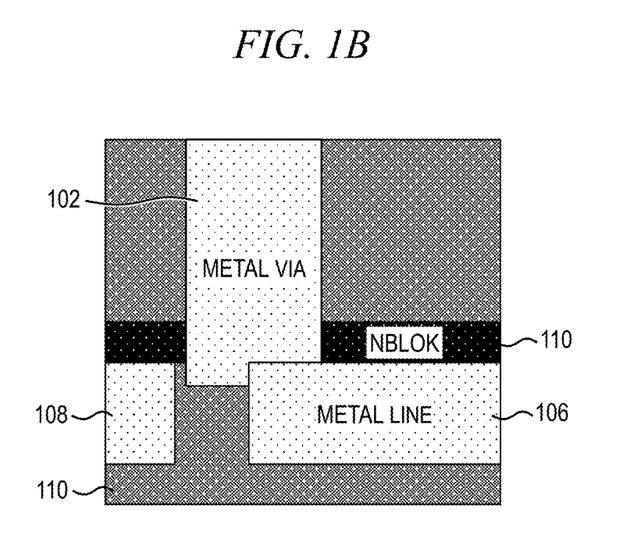
FIG. 1B is a cross-sectional view showing a close-up of the interconnect via misalignment.

Turning now to the figures, FIGS. 1A and 1B conceptually depict an illustrative interconnect via with associated misalignment; FIG. 1A is a top plan view of at least a portion of an IC showing an interconnect via, and FIG. 1B is a cross-sectional view showing a close-up of the interconnect via misalignment. With reference to FIG. 1A, an interconnect via 102 is formed which is designed to electrically connect an upper metal conductor 104 with a corresponding lower metal conductor 106. Also shown are adjacent lower metal conductors 108 which are spaced apart laterally from the metal conductor 106 to which the via 102 is connected.

As shown in FIG. 1B, a capping layer 110, which may be nitrogen doped BLOK (NBLOK) or low-k NBLOK, is formed over the lower metal conductors 106, 108. This layer is etched during via formation so that the via 102 can make electrical connection with the corresponding lower metal conductor 106. The IC also includes an interlevel dielectric (ILD) layer 112 formed over the IC. This ILD layer fills the spaces between adjacent metal conductors 106, 108 to electrically isolate the metal conductors from one another.

Ideally, the IC is patterned (e.g., using photolithographic and etching processes) such that the via 102 is formed directly on the lower metal conductor 106 with no overlay. However, due to misalignment in the fabrication process, the interconnect via 102 will typically overlay the corresponding lower metal conductor 106 by a certain amount, $x_o$, which may be referred to herein as an overlay error. This misalignment, depending on the extent of the overlay error, may cause the via 102 to electrically contact not only the intended lower metal conductor 106, but also the adjacent lower metal conductor 108, thereby creating an electrical short. In some cases, even when the via 102 does not actually contact the adjacent lower metal conductor 108, it may be in such close proximity as to cause time-dependent dielectric breakdown in the ILD layer 112 of the IC device, between adjacent metal conductors 106, 108, thereby resulting in reliability degradation.

Figure 1C:
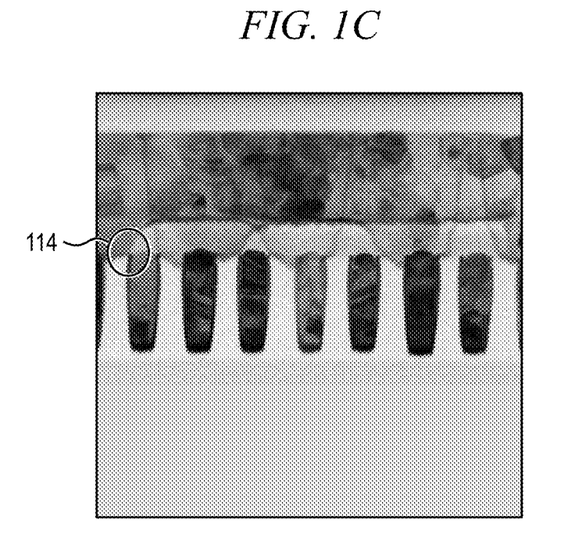
FIG. 1C is an illustrative scanning electron micrograph (SEM) depicting a cross-section of the interconnect via misalignment.

FIG. 1C is an illustrative scanning electron micrograph (SEM) depicting a cross-section of the interconnect via misalignment. Area 114 depicts an electrical short resulting from the interconnect via misalignment.

FIGS. 2A-2E are cross-sectional views depicting steps in an exemplary IC fabrication process for forming an interconnect via and a resulting misalignment of the via with its lower metal conductor. Specifically, in a first step shown in FIG. 2A, a trench or other recess is formed in a substrate 202 comprised of a low dielectric constant (low-k) dielectric material, such as, for example, a dielectric film including atoms of silicon (Si), carbon (C), oxygen (O) and hydrogen (H), SiLK (a trademark of The Dow Chemical Company), octamethylcyclotetrasiloxane (OMCT), etc. A liner 204 is formed on sidewalls and a bottom of the trench, the liner being formed of a metal nitride, such as, for example, tantalum nitride (TaN), titanium nitride (TiN), cobalt nitride (CoN), ruthenium nitride (RuN), or tungsten nitride (WN), or the like. The trench is then filled with a metal, such as, for example, copper (Cu), aluminum (Al), or alloys of Cu or Al, to form a lower metal conductor 206.

Figure 2A:
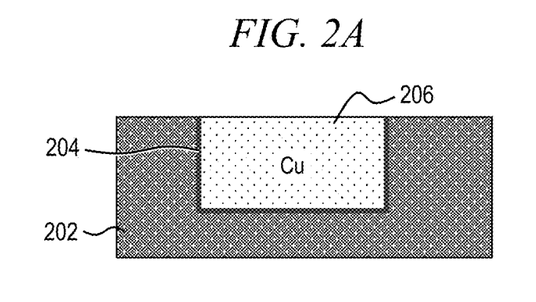
FIGS. 2A-2E are cross-sectional views depicting steps in an exemplary IC fabrication process for forming an interconnect via and a resulting misalignment of the via with its corresponding lower metal conductor.
Figure 2B:
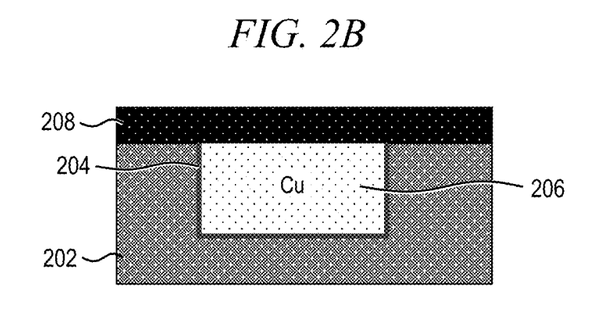
Figure 2C:
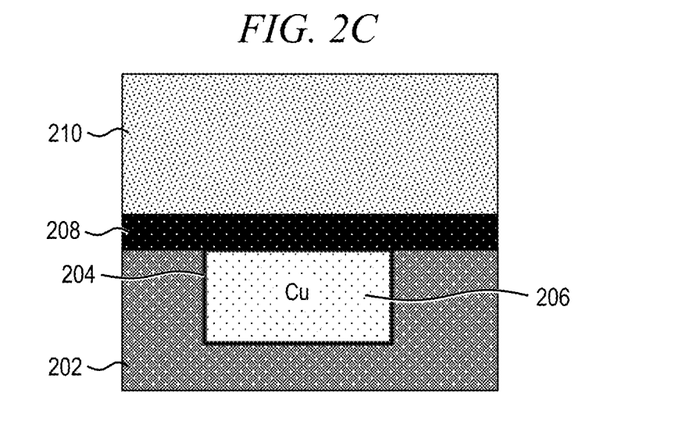

In a second step shown in FIG. 2B, a capping layer 208 is formed on an upper surface of the substrate 202, including an upper surface of the metal conductor 206, such as by a deposition process. The capping layer 208 is preferably formed of an insulating material, such as, for example, silicon nitride (SiN), silicon carbide (SiC), silicon hydride ($Si_xH_y$), or the like. In a third step shown in FIG. 2C, a low-k dielectric layer 210 is formed on an upper surface of the capping layer 208. This low-k dielectric layer 210 may be formed of the same material as the substrate 202, or it may be formed of a different material.

Figure 2D:
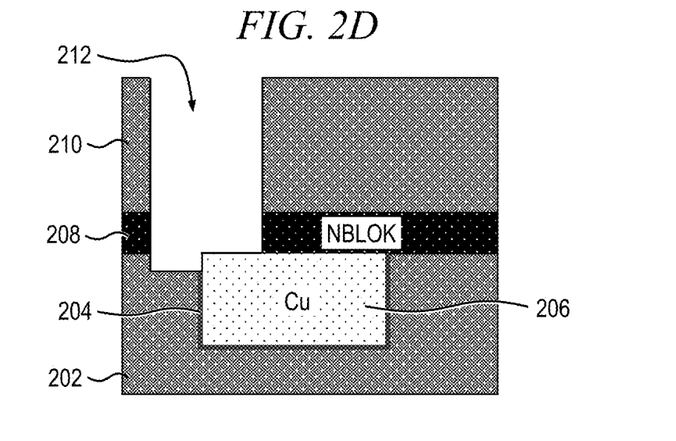

FIG. 2D depicts a fourth step which involves forming a via opening through the low-k dielectric layer 210 and capping layer 208 to access the underlying lower metal conductor 206. Specifically, a via opening 212 is formed, using standard photolithographic patterning and etching, to expose the underlying lower metal conductor 206. Ideally, this patterning and etching step only exposes the lower metal conductor 206, but as shown in FIG. 2D, a misalignment has occurred in forming the via opening 212 and a portion of underlying substrate 202 is also exposed through the opening. Since the etching is not selective between the capping layer 208 and the low-k dielectric material forming the substrate 202, a portion of the substrate 202 exposed through the via opening 212 is recessed.

Figure 2E:
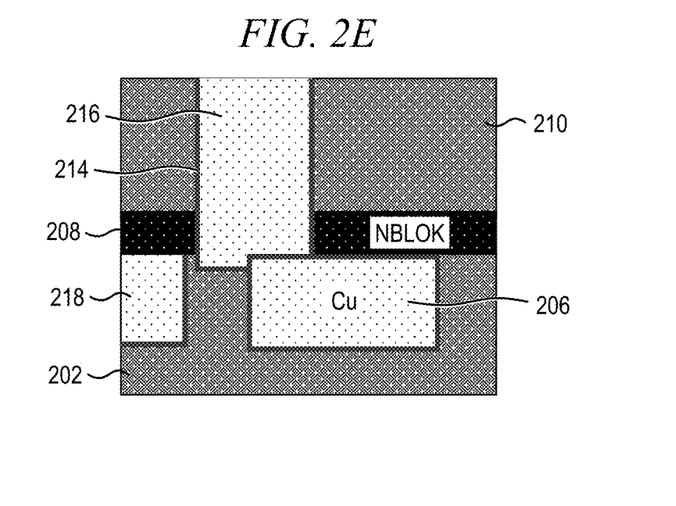

In a metallization step depicted in FIG. 2E, a conductive liner 214 is deposited on sidewalls and a bottom of the via opening 212. The opening 212 is then filled with a metal to form a via 216 used to interconnect the lower metal conductor 206 with an overlying metal conductor (not explicitly shown).

Due primarily to the misalignment in forming the via opening 212, at least a portion of the via 216 will be formed in the dielectric layer 202 between the metal conductor 206 and an adjacent lower metal conductor 218. Depending on the extent of the misalignment (i.e., the amount of overlay error) and the minimum spacing between adjacent metal conductors 206, 218, the via 216 may contact the adjacent metal conductor, thereby causing an electrical short or otherwise degrading reliability of the interconnects.

In order to alleviate the detrimental effects of misalignment in the interconnect via fabrication process, one or more embodiments of the invention beneficially prevent the via from being formed in the dielectric layer between adjacent lower metal conductors, and instead an insulating area is formed in the misaligned portion overlaying a corresponding (i.e., "target") lower metal conductor. An interconnect structure formed in this manner reduces the alignment precision otherwise required in forming vias, which is especially advantageous as device sizes continue to shrink.

Figure 3:
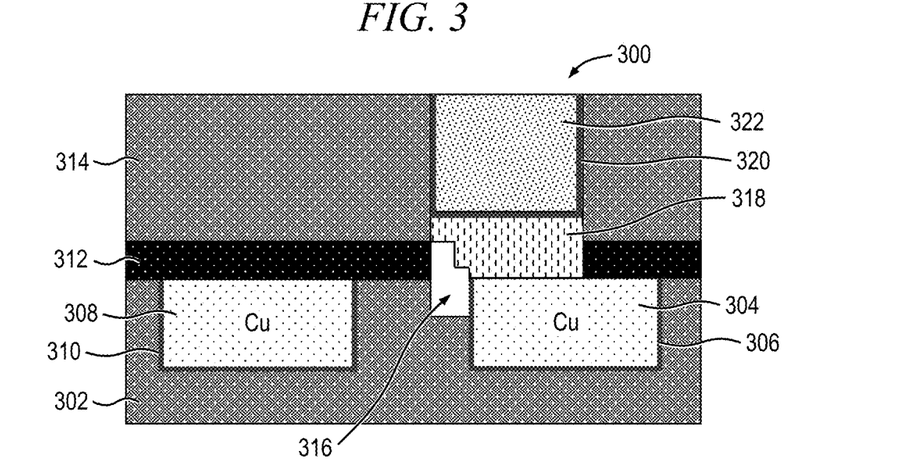
FIG. 3 is a cross-sectional view depicting at least a portion of an interconnect structure configured to reduce the effects of via misalignment, according to an embodiment of the present invention.

By way of illustration only and without limitation, FIG. 3 is a cross-sectional view depicting at least a portion of an exemplary interconnect structure 300 configured to reduce the influence of via misalignment, according to an embodiment of the invention. With reference to FIG. 3, the interconnect structure 300 includes an insulating substrate 302, which, in one or more embodiments, comprises a low-k dielectric material, such as, for example, a dielectric film including atoms of silicon (Si), carbon (C), oxygen (O), and hydrogen (H) or SiCOH, low-k organic polymers (e.g., SiLK, a trademark of The Dow Chemical Company), octamethylcyclotetrasiloxane (OMCT), etc. The interconnect structure 300 is configured to electrically connect an upper metal conductor (not explicitly shown, but implied) with an underlying lower metal conductor 304 and corresponding liner 306 formed in the low-k substrate 302. Also shown in FIG. 3 is an adjacent lower metal conductor 308 and corresponding liner 310 spaced laterally from the metal conductor 304 in the substrate 302.

A capping layer 312 is formed over an upper surface of the metal conductors 304, 308 and a low-k dielectric layer 314 is formed on an upper surface of the capping layer. The interconnect structure 300 further includes a conductive via overlying the metal conductor 304 to which electrical connection is to be made. In order to access the underlying metal conductor 304, a via opening is formed through the dielectric layer 314 and capping layer 312 to expose the metal conductor. As previously stated, however, due to misalignment in the patterning process, the opening formed through the dielectric layer 314 and capping layer 312 may extend into the dielectric substrate 302 between the metal conductor 304 and the adjacent metal conductor 308, since the etching is not selective between the capping layer 312 and dielectric substrate 302. Accordingly, an overlay region 316 will be formed in the substrate 302.

Conventionally, the interconnect via filled this overlay region 316 and, depending on the extent of the misalignment, made electrical contact with the adjacent lower metal conductor 308, thereby undesirably forming a short. In order to eliminate the possibility of the interconnect via contacting the adjacent lower metal conductor 308, one or more embodiments of the invention include a conductive pedestal 318 formed on the lower metal conductor 304 and extending over a top of the overlay region 316. The conductive pedestal 318 covers the top of the overlay region 316 preventing the interconnect via from entering the substrate between the lower metal conductors 304, 308. With the overall region 316 covered by the conductive pedestal 318, an air gap is formed in the substrate 302 which acts as an insulating area.

A conductive liner 320 is formed on sidewalls and a bottom of the via opening and the opening is then filled with a metal, or other conductive material, to form an interconnect via 322. The interconnect via 322 is electrically connected with the lower metal conductor 304 through the conductive liner 320 and conductive pedestal 318. The conductive pedestal 318 covering the overlay region 316 to form an air gap in the bottom portion of the misalignment area, the interconnect via does not come into contact with the adjacent lower metal conductor 308, thereby beneficially enhancing performance and reliability of the IC device.

FIGS. 4A-4D are cross-sectional views depicting steps in an exemplary IC fabrication process for forming an interconnect structure 400 having enhanced tolerance to misalignment of a conductive via with its corresponding lower metal conductor, consistent with the illustrative interconnect structure 300 shown in FIG. 3, according to an embodiment of the present invention. Although the overall fabrication method and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* $1^{st}$ *Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

Figure 4A:
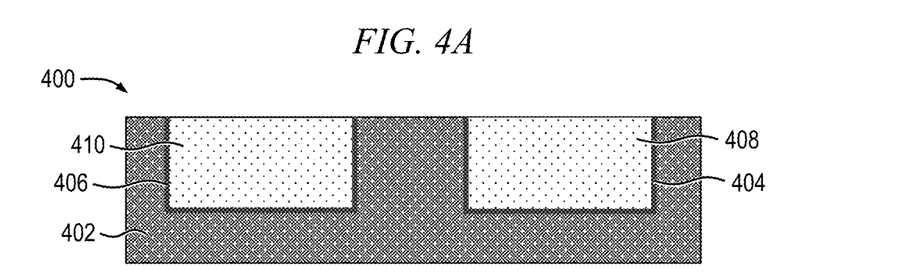
FIGS. 4A-4G are cross-sectional views depicting steps in an exemplary IC fabrication process for forming an interconnect via having enhanced tolerance to misalignment of the via with its corresponding lower metal conductor, according to an embodiment of the present invention.

With reference to FIG. 4A, the interconnect structure 400 is shown following post metallization and planarization. Specifically, the interconnect structure 400 includes an insulating substrate 402, which, in one or more embodiments, comprises a low-k dielectric material, such as, for example, a dielectric film including atoms of silicon (Si), carbon (C), oxygen (O) and hydrogen (H) or SiCOH, low-k organic polymers (e.g., SiLK, a trademark of The Dow Chemical Company), octamethylcyclotetrasiloxane (OMCT), etc. A plurality of recesses are formed in an upper surface of the substrate 402, extending at least partially into the substrate. The recesses are formed, in one or more embodiments, using standard lithographic patterning followed by etching. Other methods of forming the recesses, including reactive ion etching (RIE), are similarly envisioned.

A liner, 404 and 406, is preferably formed on a bottom and sidewalls of each of the recesses. This liner 404, 406 functions, in one or more embodiments, to prevent out-diffusion of the metal, subsequently deposited to fill the recesses, into the surrounding dielectric layer 402. The liner, in one or more embodiments, is formed of a metal nitride, such as, for example, TaN, TiN, CoN, RuN or WN, although other liner materials may be similarly employed. The recesses are then filled with a metal, or other conductive material having low resistivity, to form adjacent lower metal wires or conductors 408 and 410, as may be part of a lower metal wiring layer in the IC device. Suitable materials for forming the metal conductors include, but are not limited to, copper (Cu), aluminum (Al), tungsten (W), cobalt (Co), ruthenium (Ru), nickel (Ni), rhodium (Rh) and iridium (Ir). After this metallization process has been completed, an upper surface of the substrate 402 is planarized, such as by using a polishing process (e.g., chemical mechanical polishing/planarization (CMP)).

Figure 4B:
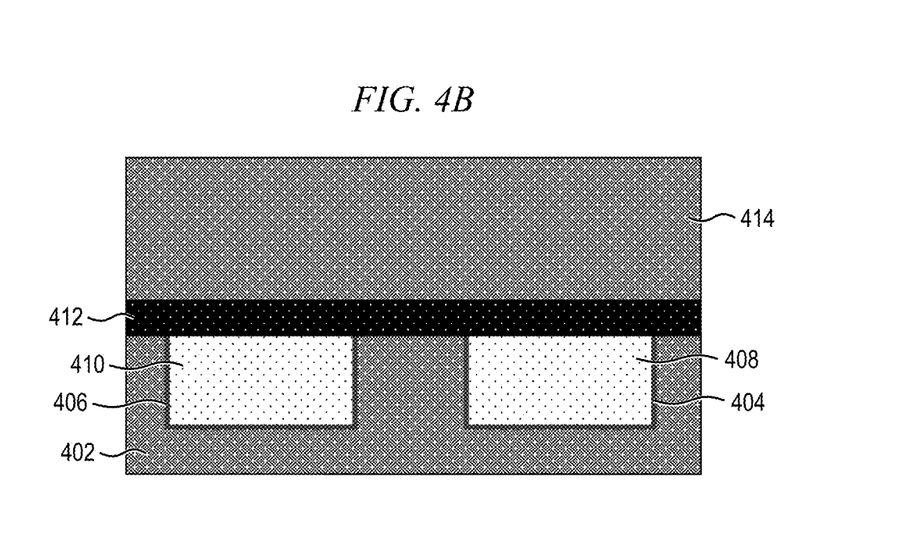

As shown in FIG. 4B, a capping layer 412 is formed on at least a portion of the upper surface of the low-k dielectric substrate 402, including upper surfaces of the lower metal conductors 408, 410. The capping layer 412, in one or more embodiments, comprises a dielectric material, such as, for example, SiN, SiC, or silicon hydride, and may be formed using a thin-film deposition process, such as chemical vapor deposition (CVD), plasma-enhanced chemical vapor deposition (PECVD), remote plasma chemical vapor deposition (RPCVD), or the like. An insulating layer 414 is then formed on an upper surface of at least a portion of the capping layer 412. The insulating layer 414, in one or more embodiments, comprises a low-k dielectric material, such as, for example, a dielectric film including SiCOH, low-k organic polymers (e.g., SiLK), OMCT, etc., which may be the same or different material compared to the material used to form the low-k substrate 402.

Figure 4C:
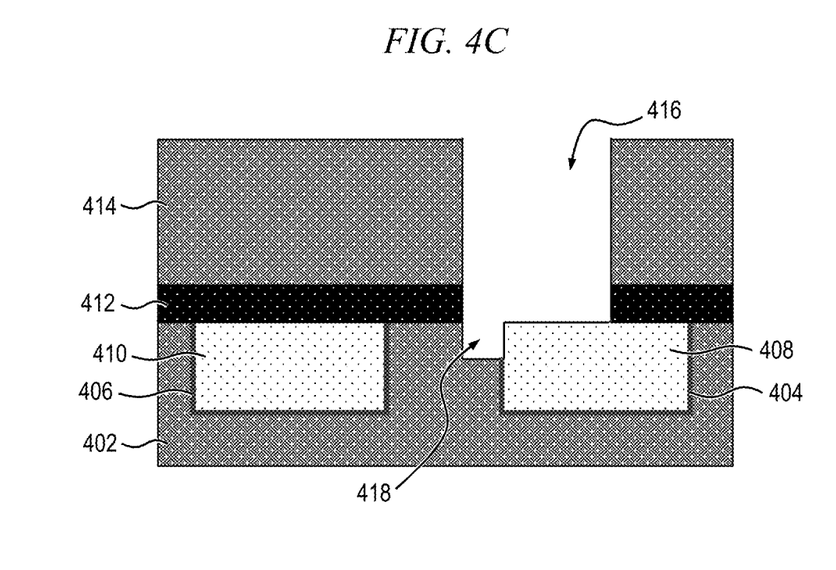

With reference now to FIG. 4C, an opening 416 is formed through an upper surface of the insulating layer 414 which will ultimately become an interconnect via. The opening 416 is formed, in one or more embodiments, using standard lithographic patterning and etching. As will be known by those skilled in the art, patterning uses a process of photolithography and optical masks to print patterns that guide the deposition or removal of material from a wafer at specific steps in the device fabrication process. Preferably, a single or dual damascene process is used to form the opening 416.

As previously explained, due to misalignment in the patterning process, among other factors, the opening 416 may overshoot the intended lower metal conductor 408. This misalignment causes the low-k dielectric material in the substrate 402 between adjacent lower metal conductors 408 and 410 to be exposed through the etching process, since the etchant used to etch through the insulating layer 414 is not selective between the capping layer 412 and the dielectric material forming the underlying substrate 402. Accordingly, an overlay region 418 will be formed in the substrate 402 between the adjacent lower metal conductors 408, 410. A width of the overlay region 418 will be a function of the extent of the misalignment in the patterning process. Thus, for a large misalignment (i.e., overlay error), the width of the overlay region 418 will be greater compared to when the misalignment is small.

Figure 4D:
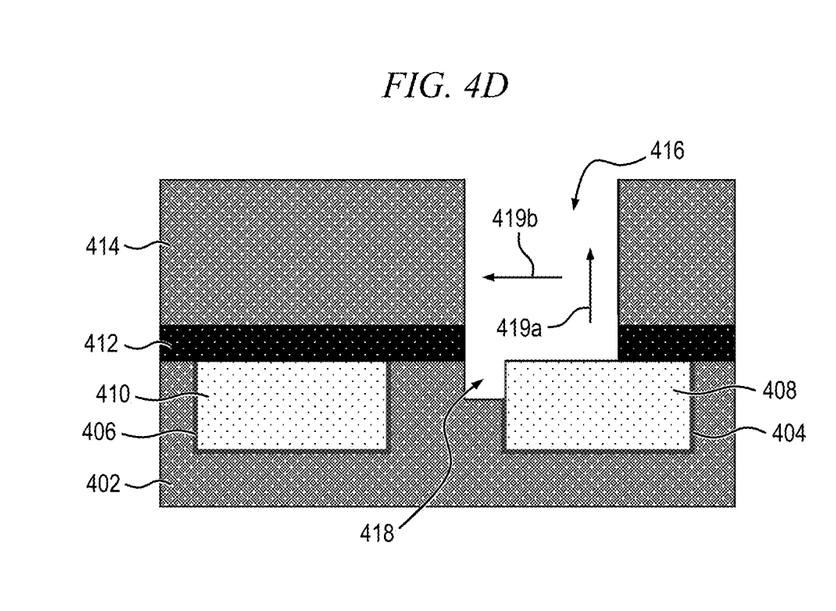
Figure 4E:
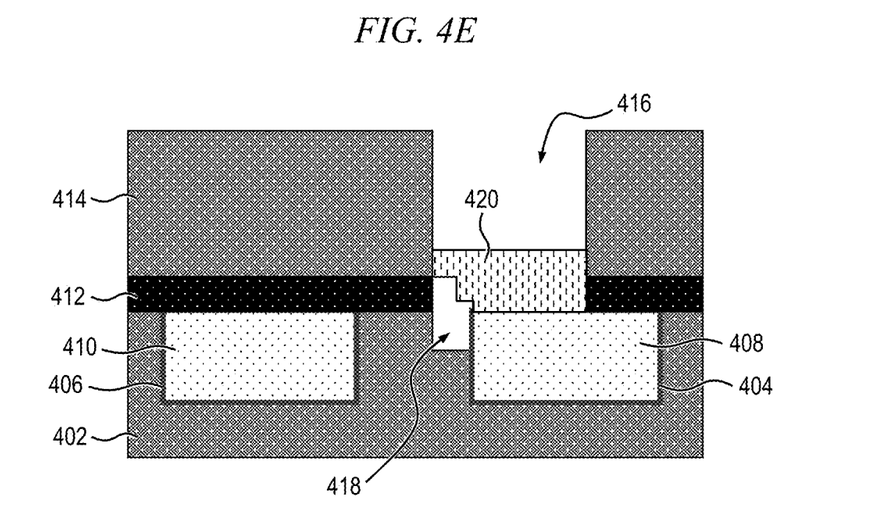

As conceptually illustrated in FIGS. 4D and 4E, a selective metal deposition process is used to essentially create a bridge over the overlay region 418. Arrows, 419a and 419b shown in FIG. 4D represent the selective growth in both vertical and horizontal directions, respectively. More particularly, arrow 419a represents an initial growth from the upper surface of the lower metal conductor 408; arrow 419b represents a horizontal growth component progression which causes a stepped, inverted triangular shape growth, as seen in FIG. 4E.

The selective metal deposition process, in one or more embodiments, involves repeatedly depositing thin metal layers on one another, beginning with an upper surface of the underlying metal conductor 408. Because the deposition is selective to metal, and not to the dielectric material, successive deposited metal layers can be progressively extended, thereby effectively shifting (to the left in this embodiment) the deposited metal layers until the metal contacts the sidewalls of the opening 416. The resulting deposited metal structure will form a conductive pedestal 420 which covers the overlay region 418 to form an insulating air gap underneath, as shown in FIG. 4E. In one or more embodiments, the deposited metal comprises, for example, Co, Ru, W, Ir, Rh, Al, Ni, tantalum (Ta), titanium (Ti), or alloys of one or more of these metals. The metal can be deposited using a standard selective metal capping process, such as, for example, CVD, atomic layer deposition (ALD), electroless deposition, etc., as will become apparent to those skilled in the art.

Figure 4F:
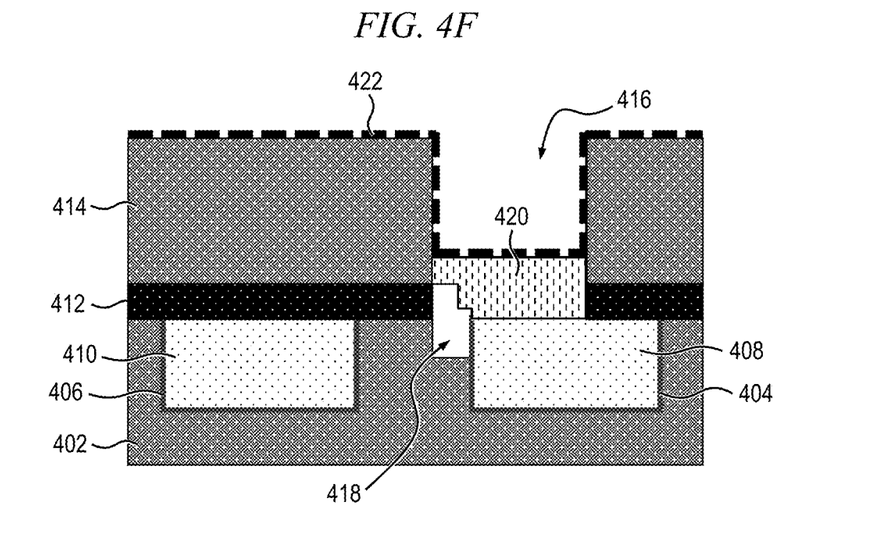
Figure 4G:
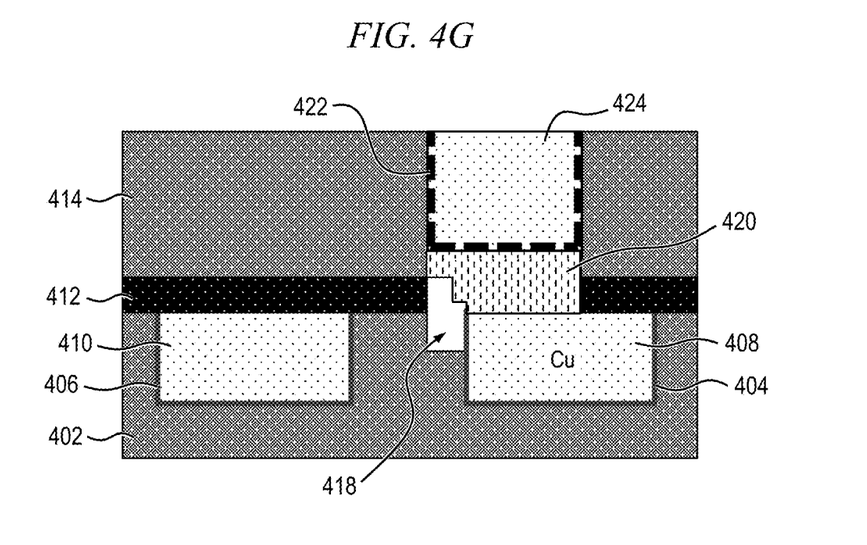
Figure 5:
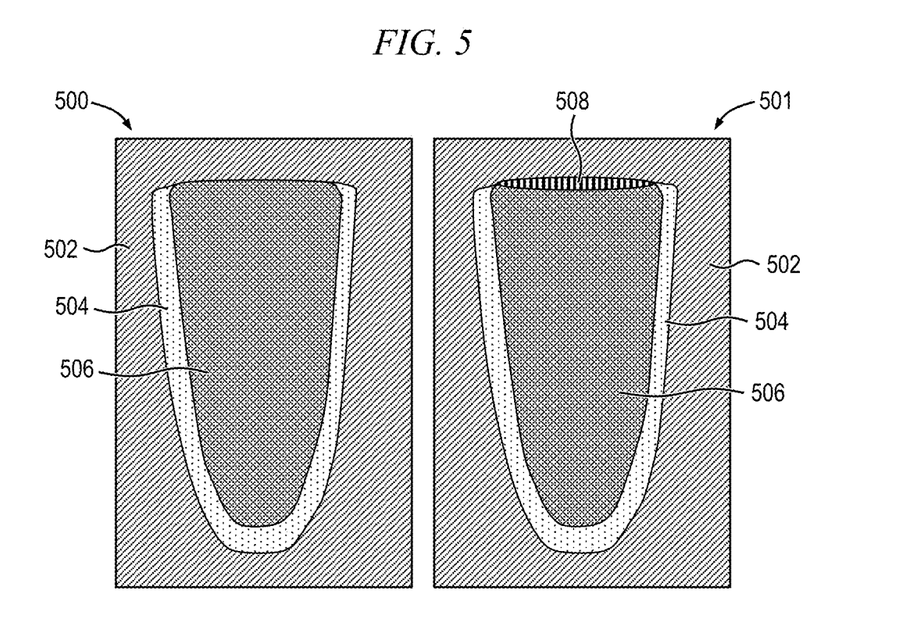
FIG. 5 is a cross-sectional view conceptually depicting a selective metal deposition process which can be used in conjunction with embodiments of the present invention.

FIG. 5 conceptually depicts a selective metal deposition process which can be used in conjunction with one or more embodiments of the invention. The left panel 500 of FIG. 5 shows a cross section of a via structure formed in a dielectric material 502 with a thin liner 504, and then filled with copper material 506. The right panel 501 of FIG. 5 shows essentially the same via structure, except there is a selective thin metal cap 508 grown on an upper surface of the copper via 506 using, for example, the progressive metal growth method shown in FIG. 4 (e.g., conductive pedestal 420). As apparent from FIG. 5, the thin metal cap 508 only grows selectively from the upper surface of the copper material 506, but not on the dielectric material 502 or the liner 504.

A barrier or liner 422 is formed over the wafer, including on the upper surface of the insulating layer 414, on sidewalls of the via opening 416, and on an upper surface of the conductive pedestal 420 which is exposed through the via opening, as shown in FIG. 4F. In one or more embodiments, the liner 422 is formed of conductive material, including, but not limited to, Ta, Ti, Co, Ru, W, Ir, and nitrides or alloys of one or more of these materials. The liner 422 functions, at least in part, to prevent out-diffusion of the metal, to be subsequently deposited to fill the via opening 416, as will be described further in conjunction with FIG. 4G, into the surrounding insulating layer 414. The conductive material forming the liner 422 may be formed, in one or more embodiments, using a deposition process, such as, for example, plasma vapor deposition (PVD), CVD or ALD.

The via opening 416 is then filled with a conductive material (e.g., a metal) to form an interconnect via 424, as shown in FIG. 4G. Suitable methods for filling the via opening 416 include, but are not limited to, physical vapor deposition (PVD), ionized metal physical vapor deposition (IMPVD), ALD, CVD, etc., as will be known by those skilled in the art. In one or more embodiments, the conductive material used to fill the via opening 416 comprises copper (Cu), although various alternative metals and/or metal alloys may be similarly employed. An upper surface of the wafer is then planarized, using, for example, CMP or an alternative planarization process, whereby the material forming liner 422 deposited on the upper surface of the insulating layer 414 is removed. As apparent from FIG. 4G, the conductive pedestal 420 prevents the deposited liner 422 and interconnect via 424 from entering into the air gap overlay region 418, thus advantageously eliminating the chance of an electrical short forming between the interconnect via 424 and the adjacent lower metal conductor 410. The via interconnect 424 is electrically connected with the underlying lower metal conductor 408 through the conductive liner 422 and conductive pedestal 420. As such, the respective materials forming the liner 422 and conductive pedestal 420 are preferably low-resistivity materials. Suitable materials for forming the liner 422 and pedestal 420 are preferably chosen to have resistivities tailored to meet prescribed resistance criteria for a given technology application, as will become apparent to those skilled in the art.

Given the discussion thus far, it will be appreciated that, in general terms, an exemplary method for fabricating a self-aligned interconnect via that beneficially prevents electrical shorting in the presence of misalignment between the interconnect via and a corresponding lower metal feature is provided, as shown in FIGS. 4A through 4G. An exemplary method includes the steps of: providing a dielectric substrate including at least first and second metal conductors in a lower metal wiring layer of the integrated circuit, the first and second metal conductors being adjacent to one another and spaced laterally from one another in the substrate; forming a capping layer over at least a portion of an upper surface of the substrate; forming an insulting layer on at least a portion of the capping layer; forming an opening through the insulating and capping layers to expose an upper surface of the first metal conductor; forming a conductive pedestal on the upper surface of the first metal conductor exposed through the opening, the conductive pedestal capping an overlay region in the dielectric substrate between the first and second metal conductors resulting from misalignment of the opening relative to the first metal conductor; forming a conductive liner on sidewalls of the opening and on an upper surface of the conductive pedestal exposed in the opening; and filling the opening with a conductive material to form the interconnect via.

Given the discussion thus far, it will also be appreciated that, in general terms, an interconnect via structure is provided that beneficially prevents electrical shorting in the presence of misalignment between the interconnect via and a corresponding lower metal feature, as shown in FIG. 3. An exemplary interconnect structure having an increased tolerance to misalignment errors in an integrated circuit includes a dielectric substrate including at least first and second metal conductors formed in a lower metal wiring layer of the integrated circuit, the first and second metal conductors being adjacent to one another and spaced laterally from one another in the substrate. A capping layer is formed over at least a portion of an upper surface of the substrate, and an insulting layer is formed on at least a portion of the capping layer. The interconnect structure further includes a conductive pedestal formed on the upper surface of the first metal conductor exposed by an opening through the insulating and capping layers, the conductive pedestal capping an overlay region in the dielectric substrate between the first and second metal conductors resulting from misalignment of the opening relative to the first metal conductor. A conductive liner is formed on sidewalls of the opening and on an upper surface of the conductive pedestal exposed in the opening, and the opening is substantially filled with a conductive material formed on the conductive liner, the conductive material forming the interconnect structure.

At least a portion of the circuits and methods described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary circuits discussed above can be distributed in raw form (i.e., a single wafer having multiple unpackaged chips), as bare dies, in packaged form, or incorporated as parts of intermediate products or end products that benefit from having classification circuitry formed in accordance with one or more of the exemplary embodiments.

The illustrations of embodiments described herein are intended to provide a general understanding of the various embodiments, and they are not intended to serve as a complete description of all the elements and/or features of apparatus, methods and systems that might make use of the structures and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of exemplary methods described herein may occur out of the order described or noted in the figures (where shown). For example, two steps described or shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below," where used, are intended to indicate positioning of elements or structures relative to each other as opposed to absolute elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of increasing a tolerance to misalignment errors in forming an interconnect structure in an integrated circuit, the method comprising:
   providing a dielectric substrate including at least first and second metal conductors in a lower metal wiring layer of the integrated circuit, the first and second metal conductors being adjacent to one another and spaced laterally from one another in the substrate;
   forming a capping layer over at least a portion of an upper surface of the substrate;
   forming an insulting layer on at least a portion of the capping layer;
   forming an opening through the insulating and capping layers to expose an upper surface of the first metal conductor;
   forming a conductive pedestal on the upper surface of the first metal conductor exposed through the opening, the conductive pedestal capping an overlay region in the dielectric substrate between the first and second metal conductors resulting from misalignment of the opening relative to the first metal conductor;
   forming a conductive liner on sidewalls of the opening and on an upper surface of the conductive pedestal exposed in the opening; and
   filling the opening with a conductive material to form the interconnect structure;
   wherein the overlay region comprises an air gap in the substrate between the first and second metal conductors which insulates the second metal conductor from the interconnect structure.

2. The method of claim 1, wherein forming the conductive pedestal comprises repeatedly performing a selective metal deposition on the upper surface of the first metal conductor to cap the overlay region and thereby prevent the interconnect structure from penetrating an area of the substrate between the first and second metal conductors.

3. The method of claim 2, wherein performing the selective metal deposition comprises at least one of chemical vapor deposition and atomic layer deposition.

4. The method of claim 1, further comprising, subsequent to filling the opening with a conductive material, planarizing an upper surface of the insulating layer and an upper surface of the interconnect structure.

5. The method of claim 4, wherein the planarizing comprises polishing the upper surface of the insulating layer and the upper surface of the interconnect structure such that the upper surface of the interconnect structure is planar with the upper surface of the insulating layer.

6. The method of claim 1, wherein forming the conductive liner on sidewalls of the opening and on the upper surface of the conductive pedestal comprises performing at least one of plasma vapor deposition, chemical vapor deposition and atomic layer deposition.

7. The method of claim 1, wherein the conductive liner formed on sidewalls of the opening and on the upper surface of the conductive pedestal comprises at least one of tantalum, titanium, cobalt, ruthenium, tungsten, iridium, and nitrides or alloys thereof.

8. The method of claim 1, wherein a width of the overlay region and a width of the conductive pedestal formed on the upper surface of the first metal conductor are a function of an extent of the misalignment error in forming the interconnect structure.

9. The method of claim 1, wherein at least one of the first and second metal conductors comprises at least one of copper, aluminum, tungsten, cobalt, ruthenium, nickel, rhodium, nickel, tantalum, titanium, and iridium.

* * * * *